(12) United States Patent
Li et al.

(10) Patent No.: US 11,053,161 B2
(45) Date of Patent: Jul. 6, 2021

(54) GLASS FLUORESCENT POWDER SLICE WITH MULTI-LAYER STRUCTURE AND PREPARATION METHOD THEREFOR, AND LIGHT-EMITTING DEVICE

(71) Applicant: APPOTRONICS CHINA CORPORATION, Shenzhen (CN)

(72) Inventors: Qian Li, Shenzhen (CN); Yanqing Deng, Shenchen (CN); Zifeng Tian, Shenzhen (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 749 days.

(21) Appl. No.: 15/120,995

(22) PCT Filed: Mar. 27, 2015

(86) PCT No.: PCT/CN2015/075172
§ 371 (c)(1),
(2) Date: Aug. 23, 2016

(87) PCT Pub. No.: WO2015/144083
PCT Pub. Date: Oct. 1, 2015

(65) Prior Publication Data
US 2017/0050879 A1 Feb. 23, 2017

(30) Foreign Application Priority Data
Mar. 28, 2014 (CN) .......................... 201410124295.3

(51) Int. Cl.
*C03C 4/12* (2006.01)
*F21V 9/30* (2018.01)
(Continued)

(52) U.S. Cl.
CPC ................. *C03C 4/12* (2013.01); *C03B 19/06* (2013.01); *C03B 25/025* (2013.01); *C03C 8/16* (2013.01);
(Continued)

(58) Field of Classification Search
CPC ......... C03C 4/12; C03C 17/04; C03C 17/009; C03C 14/006; C03C 8/16; C03C 2214/16;
(Continued)

(56) References Cited

U.S. PATENT DOCUMENTS

2012/0031486 A1 2/2012 Parce et al.
2012/0219750 A1 8/2012 Zhou et al.
(Continued)

FOREIGN PATENT DOCUMENTS

CN 102633440 A 8/2012
CN 102945914 A * 2/2013
(Continued)

OTHER PUBLICATIONS

Chinese Office Action, dated Feb. 12, 2018, and Search Report dated Feb. 5, 2018 in a counterpart Chinese patent application, No. CN 201410124295.3.
(Continued)

*Primary Examiner* — Eli D. Strah
(74) *Attorney, Agent, or Firm* — Chen Yoshimura LLP

(57) ABSTRACT

A multi-layer glass phosphor powder sheet and its preparation method, and a light-emitting device. The preparation method for the multi-layer glass phosphor powder sheet includes: mixing a first optical functional material, a glass powder and an organic carrier to obtain a first slurry, and mixing a second optical functional material, the glass powder and the organic carriers to obtain a second slurry; coating the first slurry on a first substrate, and drying it at a first temperature so that at least some of the organic carrier is
(Continued)

volatilized, to obtain a first functional layer, the first temperature being lower than a softening point of the glass powder; coating the second slurry on the surface of the first functional layer, to obtain a second functional layer; and sintering the first substrate on which the functional layers are coated at a second temperature, to obtain the multi-layer glass phosphor powder sheet.

15 Claims, 3 Drawing Sheets

(51) Int. Cl.
| | |
|---|---|
| H01L 33/50 | (2010.01) |
| C03C 17/04 | (2006.01) |
| C09K 11/08 | (2006.01) |
| C09K 11/02 | (2006.01) |
| C03C 14/00 | (2006.01) |
| F21V 13/08 | (2006.01) |
| F21V 7/24 | (2018.01) |
| C03B 19/06 | (2006.01) |
| C03B 25/02 | (2006.01) |
| C03C 8/16 | (2006.01) |
| C03C 17/00 | (2006.01) |

(52) U.S. Cl.
CPC .......... *C03C 14/006* (2013.01); *C03C 17/009* (2013.01); *C03C 17/04* (2013.01); *C09K 11/02* (2013.01); *C09K 11/025* (2013.01); *C09K 11/08* (2013.01); *F21V 7/24* (2018.02); *F21V 9/30* (2018.02); *F21V 13/08* (2013.01); *H01L 33/501* (2013.01); *B32B 2457/206* (2013.01); *C03C 2204/00* (2013.01); *C03C 2214/16* (2013.01); *C03C 2217/452* (2013.01); *C03C 2217/48* (2013.01); *C03C 2218/11* (2013.01); *C03C 2218/32* (2013.01); *C03C 2218/328* (2013.01); *H01L 2933/0041* (2013.01)

(58) Field of Classification Search
CPC .......... C03C 2217/452; C03C 2217/48; C03C 2218/11; C03C 2218/32; C03C 2218/328; C03C 2204/00; C09K 11/02; C09K 11/025; C09K 11/08; F21V 9/30; F21V 7/22; F21V 7/24; F21V 13/08; C03B 19/06; C03B 25/025; H01L 33/501; H01L 2933/0041; H01L 33/005; H01L 33/50; B32B 2457/206
See application file for complete search history.

(56) References Cited

U.S. PATENT DOCUMENTS

| | | | |
|---|---|---|---|
| 2013/0049575 A1* | 2/2013 | Fujita | C09K 11/7774 313/503 |
| 2013/0256598 A1 | 10/2013 | Aitken et al. | |
| 2013/0257264 A1* | 10/2013 | Tamaki | B05D 5/06 313/503 |
| 2015/0159836 A1 | 6/2015 | Tamaki et al. | |

FOREIGN PATENT DOCUMENTS

| | | | |
|---|---|---|---|
| CN | 102945914 A | | 2/2013 |
| CN | 103395990 A | | 11/2013 |
| EP | 2481576 A1 | | 8/2012 |
| JP | H11-288233 A | | 10/1999 |
| JP | 2004-067398 A | | 3/2004 |
| JP | 2004067398 A | * | 3/2004 |
| JP | 2006-219317 A | | 8/2006 |
| JP | 2006219317 A | * | 8/2006 |
| JP | 2013-247067 A | | 12/2013 |
| JP | 2014-015359 A | | 1/2014 |
| WO | 2007063460 A1 | | 6/2007 |
| WO | 2013144834 A1 | | 10/2013 |
| WO | 2013159664 A1 | | 10/2013 |

OTHER PUBLICATIONS

Chinese Office Action, dated Jul. 9, 2018 in a counterpart Chinese patent application, No. CN 201410124295.3.
Extended European Search Report, dated Oct. 13, 2017 in corresponding application EP 15769970.3.
Japanese Office Action, dated Sep. 5, 2017 in a counterpart Japanese patent application, No. JP 2017-501455.
Japanese Office Action, dated Mar. 13, 2018 in a counterpart Japanese patent application, No. JP 2017-501455.
Japanese Office Action, dated May 14, 2019 in a counterpart Japanese patent application, No. JP 2018-127697.
Korean Office Action, dated Nov. 15, 2017 in a counterpart application KR 10-2016-7029645.
Korean Office Action, dated May 27, 2018 in a counterpart application KR 10-2016-7029645.
Taiwanese Office Action, dated Nov. 24, 2015, in a counterpart Taiwanese patent application, No. TW 104109970.
International Search Report in the parent PCT application No. PCT/CN2015/075172, dated Jul. 3, 2015.
IPRP in the parent PCT application No. PCT/CN2015/075172, dated Oct. 4, 2016.
Annex to the communication, dated Feb. 21, 2019 in corresponding application EP 15769970.3.
Annex to the communication, dated Nov. 13, 2019 in corresponding application EP 15769970.3.
Japanese Office Action, dated Oct. 1, 2019 in a counterpart Japanese patent application, No. JP 2018-127697.

* cited by examiner

GLASS FLUORESCENT POWDER SLICE WITH MULTI-LAYER STRUCTURE AND PREPARATION METHOD THEREFOR, AND LIGHT-EMITTING DEVICE

BACKGROUND OF THE INVENTION

Field of the Invention

This invention relates to illumination and display technologies, and in particular, it relates to a glass phosphor powder sheet with a multi-layer structure and preparation method therefor, and related light-emitting device.

Description of Related Art

Phosphor powder is widely used as a wavelength conversion material in laser diode (LD) light sources and light emitting diode (LED) light sources. The phosphor powder receives an excitation light from an excitation light source, and is excited to generate and emit a converted light. In practice, the phosphor powder is usually mixed with a carrier to form a slurry, which is directly coated at a desired location to form a coating; or, the phosphor powder may be formed into a phosphor powder sheet, which is then adhered to a desired location. The phosphor sheets may be a single layer or a multi-layer structure depending on need, and the various functional layers of the multi-layer structure may be arranged as needed.

In today's high power laser light source applications, a common way to make phosphor sheets is to use silica gel as an adhesive, uniformly mixing it with a phosphor powder, and coating it on an aluminum or other metal substrate using a blade coating method. After baking at 160-260° C., a phosphor sheet is formed. However, the phosphor sheets formed using silica gel as the main adhesive has relatively poor thermal conductivity and temperature resistance, and tends to soften at high temperatures. These adversely affect the optical properties of the phosphor powder sheet, causing light conversion efficiency to drop drastically. Also, with increased power of the excitation light, the phosphor sheet can become ineffective due to blackening of the silica gel at high temperatures.

To solve the problem of poor temperature resistance of phosphor powder sheets caused by the organic adhesives, inorganic materials (glass phase) have been used as adhesives. An advantage of using glass as an adhesive is its high temperature resistance; it will not become blackened and lose its effectiveness at high temperature. Moreover, the resulting phosphor powder sheets have high hardness and are easy to assemble.

When glass is used as adhesive, it is relatively easy to make single layer phosphor powder sheets; but when making multi-layer phosphor powder sheets, difficulties may be encountered in processing, time requirement and performance. For example, because the sintering temperature required when using glass powder as adhesive is relatively high (typically over 500° C.), the glass powder does not act as an adhesive before sintering; thus, when preparing multi-layered phosphor powder sheets, typically multiple sintering steps are carried out, where the functional layers are each sequentially coated and sintered. This process is time consuming and energy consuming, and the interface structures of the multiple functional layers tend to be unstable, and sometimes cracks develop at the interfaces between layers.

Therefore, a highly efficient and energy conserving fabrication method is desired for fabricating multi-layer glass phosphor powder sheets and related light emitting devices.

SUMMARY

Embodiments of the present invention provides a highly efficient and energy conserving fabrication method for fabricating multi-layer glass phosphor powder sheets and related light emitting devices.

In one aspect, the present invention provides a method for fabricating a multi-layer glass phosphor powder sheet, which includes:

a) Mixing a first optical functional material, a glass powder and an organic carrier to form a first slurry, and mixing a second optical functional material, the glass powder and the organic carrier to form a second slurry; wherein at least one of the first optical functional material and the second optical functional material includes a phosphor powder;

b) coating the first slurry on a first substrate, and drying it at a first temperature, so that at least some of the organic carrier is volatilized, to obtain a first functional layer, the first temperature being lower than a softening point of the glass powder;

c) coating the second slurry on the surface of the first functional layer, to obtain a second functional layer; and d) sintering the first substrate which is coated with the functional layers at a second temperature, to obtain a multi-layer glass phosphor powder sheet.

Preferably, in step b), the first temperature is 50-200° C., and the drying time is 5-60 minutes.

Preferably, the first substrate is a ceramic substrate, which includes one or more of aluminum oxide, aluminum nitride, silicon carbide, silicon nitride, and zirconium oxide.

Preferably, the first substrate includes an adhesive coating, formed by: coating an adhesive slurry, which is formed by mixing the glass powder and the organic carrier, on the first substrate, and drying the first substrate at 50-200° C. for 5-60 minutes, to obtain the first substrate coated with the adhesive coating.

Further, in step d), the second temperature is 450-1500° C.

Preferably, step d) further includes annealing the sintered first substrate at a third temperature, the third temperature being 300-800° C. and lower than the second temperature.

Preferably, the first substrate is a metal substrate including one or more of aluminum, copper, aluminum alloy, and iron alloy; or, the first substrate is a ceramic substrate having a thermal expansion coefficient higher than the thermal expansion coefficients of the phosphor powder and the glass powder.

Preferably, in step d), the second temperature is 400-900° C.

Preferably, step d) further includes annealing the sintered first substrate at an annealing temperature lower than the second temperature, the annealing temperature being 200-800° C.

Preferably, the method further includes step e), releasing the multi-layer glass phosphor powder sheet from the first substrate, transferring the glass phosphor powder sheet to a second substrate, sintering the glass phosphor powder sheet and the second substrate at a fourth temperature, and releasing the glass phosphor powder sheet from the second substrate, to obtain a multi-layer glass phosphor powder sheet separate from the substrate, wherein the second substrate is a ceramic substrate, and the fourth temperature is 500-1450° C.

In any of the above methods, the glass powder includes a mixture of one or more of silicate glass, lead borosilicate glass, aluminate glass, soda lime glass, and quartz glass, which have different softening points; wherein a weight of the glass powder as a percentage of a total weight of the glass powder and the optical functional material is less than 60%.

In any of the above methods, the organic carrier is a mixture of one or more of phenyl silicone oil, methyl silicone oil, other silicone oil, ethanol, glycol, xylene, ethyl cellulose, terpineol, butyl carbitol, PVA (polyvinyl acetate), PVB (polyvinyl butyral), and PEG (polyethylene glycol).

In any of the above methods, the phosphor powder is a mixture of one or more of yellow phosphor powder, red phosphor powder, green phosphor powder, orange phosphor powder, and cyan phosphor powder.

Preferably, the first optical functional material or the second optical functional material includes high reflective particles, the high reflective particles including a mixture of one or more of powder particles of aluminum oxide, aluminum nitride, magnesium oxide, boron nitride, zinc oxide, zirconium oxide, and barium sulfate, having particle sizes between 50 nm to 5 μm.

Preferably, the first optical functional material is high reflective particles and the second optical functional material is a phosphor powder.

Preferably, each of the first optical functional material and the second optical functional material includes a phosphor powder.

Preferably, the method includes, between step c) and step d), a step f): drying the second functional layer at a temperature below the softening point of the glass powder, so that at least some of the organic carrier is volatilized; coating a third slurry formed by mixing a third optical functional material, the glass powder and the organic carrier over the second functional layer, to obtain a third functional layer.

In another aspect, the present invention provides a multi-layer glass phosphor powder sheet fabricated by any of the above methods.

Preferably, the multi-layer glass phosphor powder sheet includes at least three functional layers, including a light emitting layer containing phosphor powder or a reflective layer containing high reflective particles.

In another aspect, the present invention provides a light emitting device, which includes a multi-layer glass phosphor powder sheet fabricated by any of the above methods, and further includes an excitation light source for generating an excitation light. The multi-layer glass phosphor powder sheet receives the excitation light and emits a converted light.

Compared to conventional technology, in embodiments of the present invention, the first functional layer is dried at a temperature lower than the glass softening point of the glass powder and then coated with the second functional layer, and the two functional layers are sintered simultaneously to form the multi-layer glass phosphor powder sheet. This avoids the waste of energy and time due to multiple sintering steps, and increases the manufacturing efficiency of the multi-layer glass phosphor powder sheet. Further, because the drying is performed at a temperature lower than the softening point of the glass powder, before the sintering, the glass powder in each layer maintains their original state, and during sintering, the glass powders at the boundaries of different layers are softened and combined, which enhances the bonding between different layers. Thus, the defects of cracking and layer separation that are present in multi-layer structures fabricated by multiple separate sintering steps can be avoided.

DETAILED DESCRIPTION OF PREFERRED EMBODIMENTS

Embodiments of the invention are described in detail below with reference to the drawings.

The optical functional materials described in this disclosure include wavelength conversion materials including without limitation phosphor powders, and light reflective or scattering materials including without limitation transition metal oxides and transition metal nitrides. The optical functional materials include without limitation a first optical functional material, a second optical functional material and a third optical functional material.

First Embodiment

Figure 1:
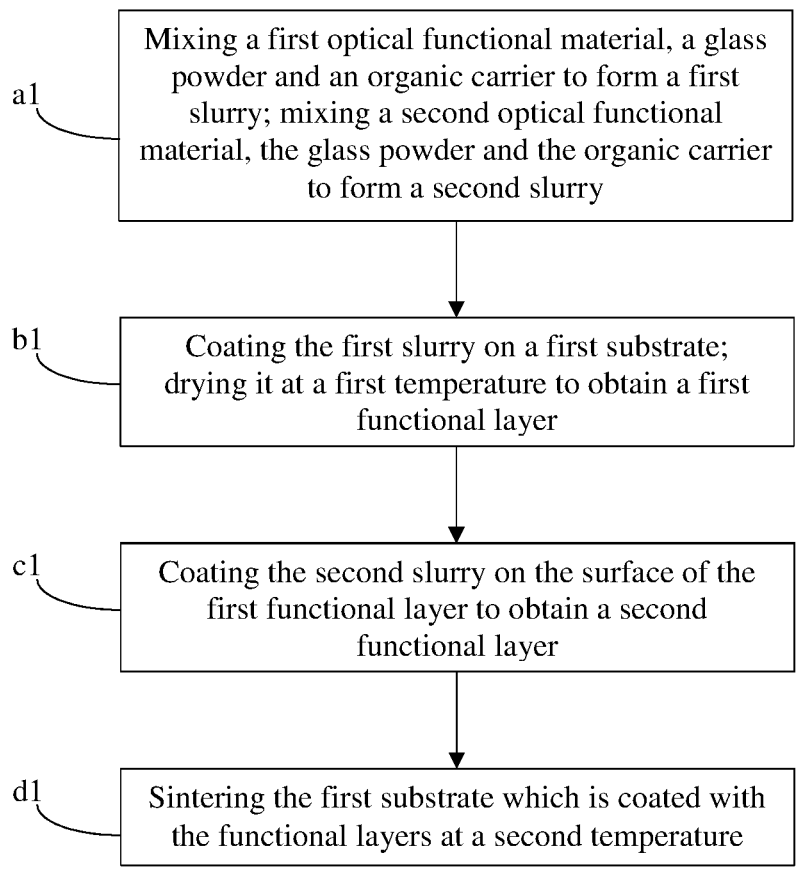
FIG. 1 schematically illustrates the flow of a fabrication method for a multi-layer glass phosphor powder sheet according to a first embodiment of the present invention.

FIG. 1 schematically illustrates the flow of a fabrication method for a multi-layer glass phosphor sheet according to a first embodiment of the present invention. The fabrication method includes:

a1) Mixing a first optical functional material, a glass powder and an organic carrier to form a first slurry, and mixing a second optical functional material, the glass powder and the organic carrier to form a second slurry.

The first and second optical functional materials are respectively the main materials that perform the functions of the first and second functional layers of the multi-layer glass phosphor powder sheets fabricated by the method of this embodiment. Based on the design of the specific multi-layer glass phosphor powder sheet, the first and second functional materials may be wavelength conversion material, scattering material, or reflective material. At least one of the first and second functional materials includes a phosphor powder.

Preferably, the first optical functional material includes high reflective particles. The high reflective particles have a very low absorption rate for light, and can reflect the vast majority of the incident light. Compared to conventional reflective materials such as metal, high reflective particles have stable chemical properties and do not oxidize easily. In this embodiment, the high reflective particles may be super white powder particles of aluminum oxide, aluminum nitride, magnesium oxide, boron nitride, zinc oxide, zirconium oxide, or barium sulfate, having particle sizes between 50 nm to 5 μm, or a mixture of the above.

The second optical functional material includes without limitation a phosphor powder. The phosphor powder is able to absorb the excitation light, and is excited to generate a converted light having different wavelengths than the excitation light. In this embodiment, the phosphor powder may be yellow phosphor powder, red phosphor powder, green phosphor powder, orange phosphor powder, or cyan phosphor powder, or a mixture of the above.

The organic carrier may be phenyl silicone oil, methyl silicone oil, other silicone oils, ethanol, glycol, xylene, ethyl cellulose, terpineol, butyl carbitol, PVA, PVB, PAA, or PEG, or a mixture of the above. The organic carrier has sufficient viscosity, and wets the glass powder, phosphor powder and high reflective particles easily to mix them into a uniform mixture. Most of the organic carrier will volatize under low temperature drying, and after sintering, it either completely disappears or only leaves a small amount of residue which does not affect the light emission of the phosphor powder.

Glass powder is an irregularly shaped, particulate, homogeneous glass substance, which is highly transparent and has stable chemical properties. In the glass phosphor powder sheets, the function of the glass is to adhere the phosphor powder, and to insulate the phosphor powder from the air to prevent the phosphor powder from becoming oxidized or damp. The glass powder in this embodiment may be one or more of silicate glass, lead silicate glass, aluminum borosilicate glass, aluminate glass, soda lime glass, and quartz glass, which have different softening points.

Preferably, the weight of the glass powder as a percentage of the total weight of the glass powder and optical functional material is less than 60%. If the percentage of the glass powder is too high, when the glass softens under high temperature, it may cause a higher fluidity of the entire functional layer or glass phosphor powder sheet as compared to a relatively low glass powder percentage. This may cause the functional layers of the glass phosphor powder sheet to have non-uniform thickness and irregular shape.

The method of mixing for the slurry may include mechanical stirring, ball milling, or ultrasonic dispersion, to obtain a uniform and homogenous slurry through mixing.

The step a1) may be carried out any time before coating the slurry; but to prevent the slurry from settling due to being laid aside for a long time, preferably, the slurry is prepared right before coating.

b1) Coating the first slurry on a first substrate, and drying it at a first temperature, so that at least some of the organic carrier is volatilized, to obtain a first functional layer.

The first temperature is lower than the softening point of the glass powder. Preferably, the first temperature is 50-200° C., and the drying time is 5-60 minutes. The first functional layer obtained this way is a reflective layer with a smooth surface and free of cracks, and the particles on the surface of the reflective layer will not fall off.

The first substrate is a plate for carrying the first slurry, so that the first slurry can be formed into the first functional layer. Preferably, the first substrate is a ceramic substrate. In this embodiment, the ceramic substrate may be aluminum oxide, aluminum nitride, silicon carbide, silicon nitride, or zirconium oxide, which are ceramic substrates having high temperature resistance and high thermal conductivity, so that the substrate can withstand the high temperature of the subsequent sintering step.

When drying in the 50-200° C. temperature range, the glass powder will not soften and deform, and does not exhibit adhesiveness. Due to the properties of the organic carrier, a part of it is volatized during the drying, and this process occurs in 5-60 minute time period. This not only reduces the drying time, but also reduces the time required by conventional processes to raise and cool down the sample temperature. Thus, this process is highly efficient and energy conserving. After drying, the residual organic carrier adheres the glass powder and high reflective particles into an integral mass, and also forms a film of organic substance on the surface of the reflective layer, making the surface flat, smooth, and workable. It also prevents the particles on the surface of the reflective lay from falling off, so as to keep the form of the layer in the subsequent process steps.

The first slurry can be coated on the first substrate using blade coating, dipping, spraying, etc., so the thickness of the slurry is uniform. When the reflective layer is not completely dried, it has certain plasticity, and can be treated with edge trimming, etc., to make the reflective layer smoother with fewer rough edges.

The reflective layer has a light reflective property, and its reflectivity increases with its thickness within a certain range. However, if the layer is too thick, its thermal resistance will be high. Therefore, the thickness of the reflective layer is preferably 50-300 µm.

c1) Coating the second slurry on the surface of the first functional layer, to obtain a second functional layer.

In this embodiment, the first functional layer may be a reflective layer, and the second functional layer is preferably a light emitting layer. The second slurry may be coated on the reflective layer using blade coating, dipping, spraying, etc. The first functional layer (the reflective layer), which is formed by the drying step b1), has sufficiently surface strength, so the coating of the second slurry will not damage the surface of the reflective layer.

d1) Sintering the first substrate which is coated with the functional layers at a second temperature, to obtain a multi-layer glass phosphor powder sheet.

In this embodiment, preferably, the first ceramic substrate, which has been coated with the first functional layer (the reflective layer) and the second functional layer (the light emitting layer), is placed in an electric furnace, and sintered under the second temperature to obtain the finished product of the glass phosphor powder sheet. The glass phosphor powder sheet can be used in reflective-type high power laser light sources.

In this embodiment, sintering may be conducted under various conditions such as atmospheric pressure, vacuum, protective gas, etc., based on need. The sintering temperature, i.e. the second temperature, can be adjusted in the range of 450-1500° C. depending on the different softening points of the glass powder, ensuring that the second temperature is higher than the softening point of the glass powder.

Preferably, during cooling, an annealing step may be carried out at temperatures below the second temperature, and the annealing temperature may be adjusted in the range of 300-800° C. Annealing can eliminate the internal stress in the glass phosphor powder sheet, and enhance its stability.

Before sintering, the first functional layer (the reflective layer) and the second functional layer (the light emitting layer), are both raw materials, where the glass powder in each of them maintains its original state; during sintering, the glass powders in both layers are softened and are joined together, which enhances the bonding at the interface of the two layers. Thus, the defects of cracking and layer separation can be avoided. Moreover, because the glass powders in the reflective layer and the light emitting layer undergo the same sintering process, the uniformity of the glass phosphor powder sheet is improved.

Based on the first embodiment, a second embodiment is also provided, as described below.

Second Embodiment

Figure 2:
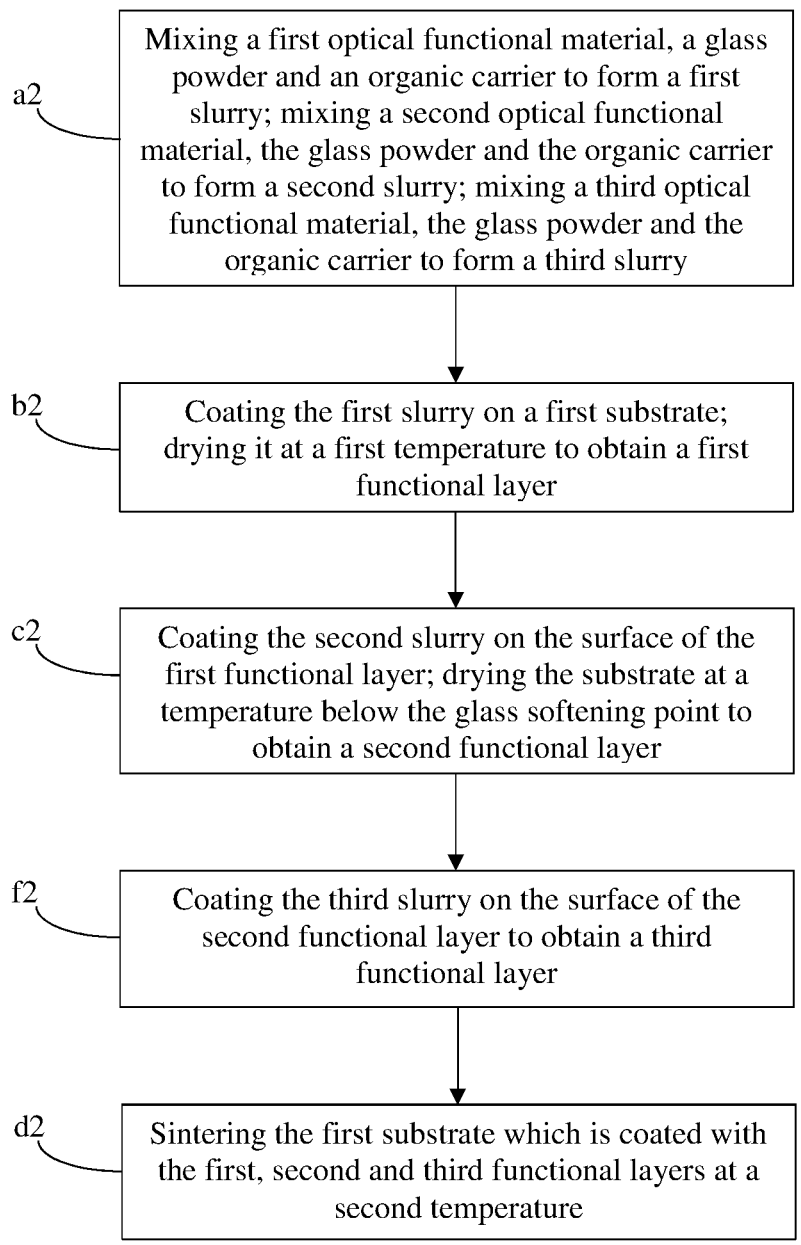
FIG. 2 schematically illustrates the flow of a fabrication method for a multi-layer glass phosphor powder sheet according to a second embodiment of the present invention.

FIG. 2 schematically illustrates the flow of a fabrication method for a multi-layer glass phosphor powder sheet according to a second embodiment of the present invention. The fabrication method includes:

a2) Obtaining a first optical functional material, a second optical functional material, a third optical functional material, a glass powder, and an organic carrier; mixing the first optical functional material, the glass powder and the organic carrier to form a first slurry, mixing the second optical functional material, the glass powder and the organic carrier to form a second slurry, and mixing the third optical functional material, the glass powder and the organic carrier to form a third slurry.

Preferably, the first optical functional material includes high reflective particles. The high reflective particles have a very low absorption rate for light, and can reflect the vast majority of the incident light. Compared to conventional reflective materials such as metal, high reflective particles have stable chemical properties and do not oxidize easily. In this embodiment, the high reflective particles may be super white powder particles of aluminum oxide, aluminum nitride, magnesium oxide, boron nitride, zinc oxide, zirconium oxide, or barium sulfate, having particle sizes between 50 nm to 5 µm, or a mixture of the above.

Preferably, the second optical functional material includes a first phosphor powder. The first phosphor powder is able to absorb the excitation light, and is excited to generate a converted light having different wavelengths than the excitation light. In this embodiment, the phosphor powder may be yellow phosphor powder, red phosphor powder, green phosphor powder, orange phosphor powder, or cyan phosphor powder, or a mixture of the above.

Preferably, the third optical functional material includes a second phosphor powder. The second phosphor powder is able to absorb the excitation light, and is excited to generate a converted light having different wavelengths than the excitation light. In this embodiment, the phosphor powder may be yellow phosphor powder, red phosphor powder, green phosphor powder, orange phosphor powder, or cyan phosphor powder, or a mixture of the above.

In this embodiment, the first phosphor powder and the second phosphor powder may be different types of phosphor powders. In certain special applications that have special requirements on the phosphor powder sheets, such as light generating efficiency, color rendering index, color coordinates, etc., a single phosphor powder cannot satisfy these requirements. Using a mixture of two or more different types of phosphor powders or a multi-layer phosphor powder sheets, two converted lights of different wavelengths can be generated by the excitation light and combined together, to solve the above problems.

The second phosphor powder and the first phosphor powder may also be the same phosphor powder. When fabricating relatively thick phosphor powder sheets, because the densities of the phosphor powder and the glass powder are different, it is possible that the concentration of phosphor powder may be different for the upper portion and the lower portion of the phosphor powder sheet. The thicker the phosphor powder sheet, the longer the fabrication time, the greater the difference between the concentrations of phosphor powder in the upper and lower portions of the phosphor powder sheet. By forming multiple thinner phosphor powder sheets and stacking them, the uniformity of the phosphor powder sheet can be improved. In another situation, for a uniform phosphor powder sheet, the side closer to the excitation light source is excited more, and the side farther away from the excitation light source is excited less, causing non-uniform generation of converted light in the phosphor powder sheet. As a result, the overall light generation efficiency of the phosphor powder sheet is lower and the temperature is also non-uniform. By stacking together two phosphor powder sheets with different phosphor powder concentrations, a phosphor powder sheet having non-uniform phosphor powder concentration distribution is obtained; the part having a lower phosphor powder concentration can be placed closer to the excitation light source and the part having a higher phosphor powder concentration can be placed farther away from the excitation light source. This way, more excitation light can illuminate the side of the phosphor powder sheet that is farther away from the excitation light source, so the light generation and heat generation of the phosphor powder sheet is more uniform.

b2) Coating the first slurry on a first substrate, and drying it at a first temperature, so that at least some of the organic carrier is volatilized, to obtain a first functional layer.

In this embodiment, preferably, the first slurry includes high reflective particles, and the first optical functional layer is a reflective layer.

Preferably, the first temperature is 50-200° C., far below the softening point of the glass powder. The drying time under the first temperature is 5-60 minutes. The first functional layer obtained this way is a reflective layer with a smooth surface and free of cracks, and the particles on the surface of the reflective layer will not fall off.

Preferably, the first substrate is a ceramic substrate. In this embodiment, the ceramic substrate may be aluminum oxide, aluminum nitride, silicon carbide, silicon nitride, or zirconium oxide. These ceramic substrates can withstand high temperature and have high thermal conductivities, so that the substrate can withstand the high temperature of the subsequent sintering step.

The first slurry can be coated on the first substrate using blade coating, dipping, spraying, etc., so the thickness of the slurry is uniform. When the reflective layer is not completely dried, it has certain plasticity, and can be treated with edge trimming, etc., to make the reflective layer smoother with fewer rough edges.

c2) Coating the second slurry on the surface of the first functional layer, to obtain a second functional layer (the first light emitting layer). The substrate is dried in a furnace for 5-60 minutes at a temperature of 50-200° C., to obtain a first light emitting layer with a smooth surface and free of cracks, where the particles on the surface of the reflective layer will not fall off.

When drying in the 50-200° C. temperature range, the glass powder will not soften and deform, and does not exhibit adhesiveness. Due to the properties of the organic carrier, a part of it is volatized during the drying, and this process occurs in 5-60 minute time period. This not only reduces the drying time, but also reduces the time required by conventional processes to raise the temperature and cool down the sample. Thus, this process is highly efficient and energy conserving. After drying, the residual organic carrier adheres the glass powder and phosphor powder particles into an integral mass, and prevents the particles on the surface of the first light emitting lay from falling off, so as to keep the form of the layer in the subsequent process steps.

The second slurry can be coated on the first functional layer (the reflective layer) using blade coating, dipping, spraying, etc., so the thickness of the slurry is uniform. When the first light emitting layer is not completely dried, it has certain plasticity, and can be treated with edge trimming, etc., to make the first light emitting layer smoother with fewer rough edges.

f2) Coating the third slurry on the surface of the first light emitting layer, to obtain a third functional layer (the second light emitting layer).

The third slurry can be coated on the first functional layer using blade coating, dipping, spraying, etc., so the thickness of the slurry is uniform. The first light emitting layer, which is formed by the drying step c2), has sufficiently surface strength, so the coating of the third slurry will not damage the surface of the first light emitting layer.

d2) Placing the glass phosphor powder sheet, which includes the ceramic substrate, the first functional layer (the reflective layer), the second functional layer (the first light emitting layer), and the third functional layer (the second light emitting layer) in an electric furnace, and sintering it under the second temperature to obtain the finished product of the glass phosphor powder sheet. The glass phosphor powder sheet can be used in reflective-type high power laser light sources.

Sintering may be conducted under various conditions such as atmospheric pressure, vacuum, protective gas, etc., based on need. The sintering temperature (the second temperature) can be adjusted in the range of 450-1500° C. depending on the different softening points of the glass powder, ensuring that the sintering temperature is higher than the softening point of the glass powder. During cooling, an annealing step may be carried out at temperatures below the second temperature. The annealing temperature may be adjusted in the range of 300-800° C. depending on the sintering temperature. Annealing can eliminate the internal stress in the glass phosphor powder sheet, and enhance its thermal stability and mechanical properties.

Before sintering, the reflective layer, the first light emitting layer, and the second light emitting layer are all raw materials, where the glass powder in each of them maintains its original state. During sintering, the glass powders in all three layers are softened, and glass powders in adjacent layers are joined together, which enhances the bonding between the adjacent ones of the three layers. Thus, the defects of cracking and layer separation can be avoided. Moreover, because the glass powders in the reflective layer and the first and second light emitting layers undergo the same sintering process, the uniformity of the glass phosphor powder sheet is improved.

In this embodiment, the multi-layer glass phosphor powder sheet includes the reflective layer, the first light emitting layer, and the second light emitting layer, i.e. a total of three functional layers. Compared to the first embodiment, there is an additional second light emitting layer (the third functional layer). In fact, based on practical need, using the same method of adding the third functional layer, more functional layers may be added to obtain a multi-layer glass phosphor powder sheet having more than three functional layers. Detailed descriptions are omitted here.

Third Embodiment

Figure 3:
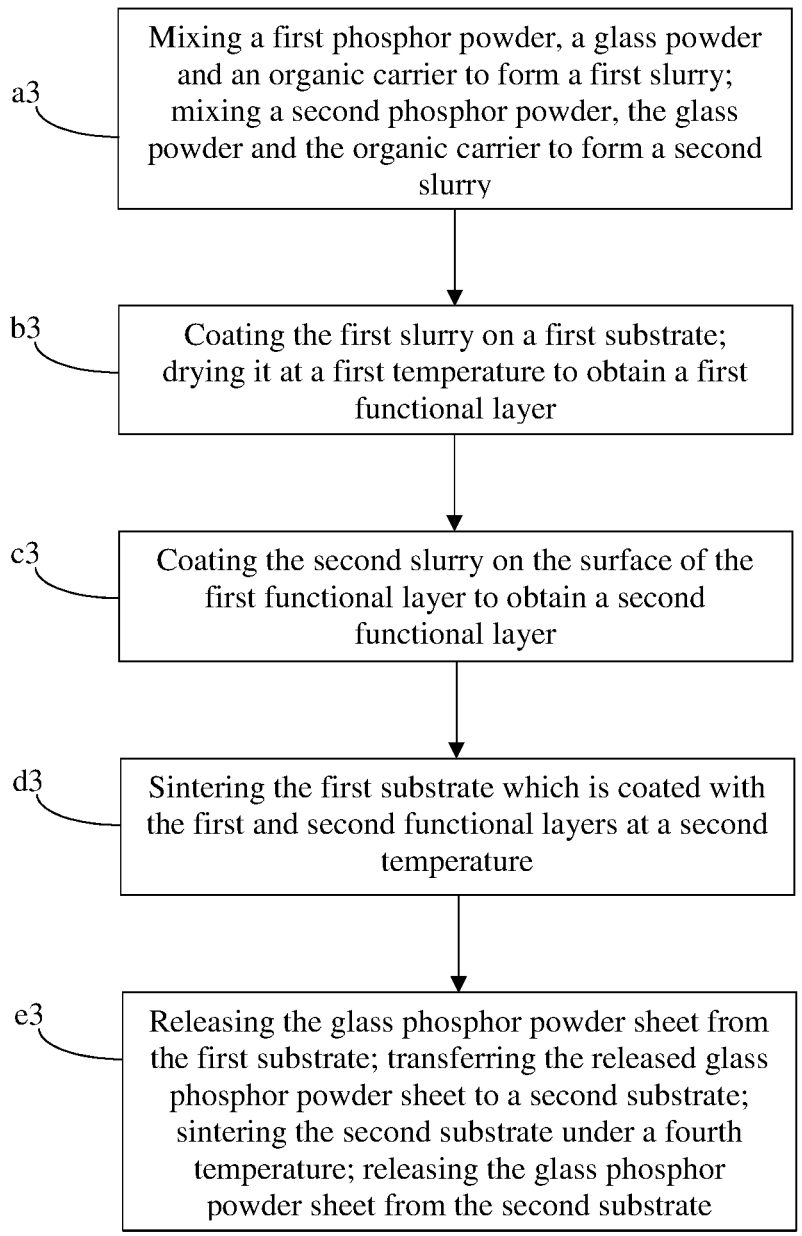
FIG. 3 schematically illustrates the flow of a fabrication method for a multi-layer glass phosphor powder sheet according to a third embodiment of the present invention.

FIG. 3 schematically illustrates the flow of a fabrication method for a multi-layer glass phosphor powder sheet according to a third embodiment of the present invention. The fabrication method includes:

a3) Obtaining a first optical functional material (a first phosphor powder), a second optical functional material (a second phosphor powder), a glass powder, and an organic carrier; mixing the first phosphor powder, the glass powder and the organic carrier to form a first slurry, and mixing the second phosphor powder, the glass powder and the organic carrier to form a second slurry.

For details of step a3), refer to the description of step a1) in the first embodiment.

b3) Coating the first slurry on a first substrate, and drying it at a first temperature, to obtain a first functional layer (a first light emitting layer).

Preferably, the first temperature is 50-200° C., far below the softening point of the glass powder. The drying time under the first temperature is 5-60 minutes. The first functional layer obtained this way is a first light emitting layer with a smooth surface and free of cracks, and the particles on the surface of the first light emitting layer will not fall off.

In this embodiment, preferably, the first substrate is a metal substrate, including but not limited to aluminum, copper, aluminum alloy, and iron alloy. Metal substrates have relatively high thermal expansion coefficients, which is substantially different form the thermal expansion coefficients of the phosphor powder and glass powder; therefore, during sintering, the metal substrate and the glass phosphor powder sheet have substantially different deformations due to thermal expansion, which facilitates release of the glass phosphor powder sheet from the substrate.

The metal substrate may also be replaced by a ceramic substrate having a relatively high thermal expansion coefficient, such that the thermal expansion coefficient of the substrate is substantially greater than those of the phosphor powder and glass powder, so as to achieve the same effect as the metal substrate.

c3) Coating the second slurry on the surface of the first light emitting layer, to obtain a second functional layer (a second light emitting layer).

In this embodiment, the second phosphor powder and the first phosphor powder may be the same phosphor powder or different phosphor powders.

d3) Placing the glass substrate powder sheet including the first substrate, the first functional layer, and the second functional layer in an electric furnace, and sintering it under the second temperature.

Sintering may be conducted under various conditions such as atmospheric pressure, vacuum, protective gas, etc., based on need. The sintering temperature (the second temperature) can be adjusted in the range of 400-900° C. depending on the different softening points of the glass powder, ensuring that the sintering temperature is within 100° C. of the softening point of the glass powder. During cooling, an annealing step may be carried out at temperatures between 200-800° C., to eliminate the internal stress in the glass phosphor powder sheet. Before sintering, the first light emitting layer and the second light emitting layer are both raw materials, where the glass powder in each of them maintains its original state. During sintering, the glass powders in the two layers are softened and joined together, which enhances the bonding between the two layers. Thus, the defects of cracking and layer separation can be avoided. During cooling, because the thermal expansion coefficients of the glass phosphor powder sheet and the first substrate are different, their amounts of contraction are different, so that the glass phosphor powder sheet can be released in one piece from the substrate.

e3) Releasing the glass phosphor powder sheet from the first substrate, and transferring the released glass phosphor powder sheet to a second substrate. The substrate and the layers are sintered under a fourth temperature, then the glass phosphor powder sheet is released from the second substrate to obtain a multi-layer glass phosphor powder sheet separate from the substrate.

In this embodiment, preferably, the second substrate is a ceramic substrate. The sintering temperature (the fourth temperature) is higher than the softening point of the glass powder. Depending on the different glass powder used, preferably, the fourth temperature is 500-1450° C. During sintering, the glass powder is in a liquid or semi-liquid state. When the amount of the glass powder is appropriate, during sintering, the melting and flow of the glass of the glass phosphor powder sheet will not cause the glass phosphor powder sheet to adhere to the ceramic substrate. This is mainly because the glass phosphor powder sheet is placed on top of the ceramic substrate, and there is a relatively large space between the particles of the two. When the glass powder gradually softens and becomes increasingly fluid, it will first combine with the nearby phosphor powder particles and other glass powder particles, and does not tend to flow and wet the surface of the ceramic substrate to form an adhesion that is hard to release. Also, because the weight of the glass powder as a percentage of the total weight of the glass powder and phosphor powder is less than 60%, when the softened glass powder is combined with the phosphor powder particles and other glass powder, there is very little remaining free softened glass powder and it is hard to form an effective bonding with the ceramic substrate. This facilitates release of the sheet from the substrate.

In this embodiment, the thermal expansion coefficient of the second substrate is close to that of the glass phosphor powder sheet, so it prevents cracking and other defects of the glass phosphor powder sheet due to substantial differences of thermal expansion coefficients under high temperature. Also, ceramic substrates have good thermal stability and its surface properties do not change significantly under high temperature (while many metals have dramatically increased surface adsorption capacity and adhesiveness when they reach red hot temperatures). Moreover, the surfaces of ceramic substrates have more microscopic roughness than metal surfaces, so it is less likely to adhere to the glass phosphor powder sheet, which facilitates release of the glass phosphor powder sheet from the substrate.

Fourth Embodiment

A fabrication method for a multi-layer glass phosphor sheet according to a fourth embodiment of the present invention includes:

a4) Obtaining a first optical functional material (high reflective particles), a second optical functional material (a first phosphor powder), a third optical functional material (a second phosphor powder), a glass powder, and an organic carrier; mixing the high reflective particles, the glass powder and the organic carrier to form a first slurry, mixing the first phosphor powder, the glass powder and the organic carrier to form a second slurry, and mixing the second phosphor powder, the glass powder and the organic carrier to form a third slurry.

For details of step a4), refer to the description of step a2) in the second embodiment.

b4) Coating the first slurry on a first substrate (ceramic substrate), and drying it at a first temperature (50-200° C.) for 5-60 minutes, to obtain a first functional layer (reflective layer) that has a smooth surface and is free of cracks and where the particles on the surface of the reflective layer will not fall off.

For details of step b4), refer to the description of step b2) in the second embodiment.

Preferably, the ceramic substrate has a thermal expansion coefficient higher than those of the glass powder and phosphor powders.

c4) Coating the second slurry on the surface of the reflective layer, to obtain a second functional layer (first light emitting layer). The substrate is dried in a furnace for 5-60 minutes at a temperature of 50-200° C., to obtain a first light emitting layer with a smooth surface and free of cracks and where the particles on the surface of the reflective layer will not fall off.

For details of step c4), refer to the description of step c2) in the second embodiment.

f4) Coating the third slurry on the surface of the first light emitting layer, to obtain a third functional layer (second light emitting layer).

For details of step f4), refer to the description of step f2) in the second embodiment.

d4) Placing the glass phosphor powder sheet, which includes the ceramic substrate, the reflective layer, the first light emitting layer, and the second light emitting layer in an electric furnace, and sintering it under a temperature closed to the glass softening point.

Sintering may be conducted under various conditions such as atmospheric pressure, vacuum, protective gas, etc., based on need. The sintering temperature can be adjusted in the range of 400-900° C. depending on the different softening points of the glass powder, ensuring that the sintering temperature is within 100° C. of the softening point of the glass powder. During cooling, an annealing step may be carried out at temperatures between 200-800° C., to eliminate the internal stress in the glass phosphor powder sheet. During cooling, because the thermal expansion coefficients of the glass phosphor powder sheet and the substrate are different, their amounts of contraction are different, so that the glass phosphor powder sheet can be released in one piece from the substrate.

e4) Releasing the glass phosphor powder sheet from the ceramic substrate, and transferring the released glass phosphor powder sheet to another flat and smooth ceramic substrate. The substrate and the layers are sintered at a 500-1450° C. temperature, then the layers are released from the substrate to obtain the multi-layer glass phosphor powder sheet that is separate from the substrate.

For details of step e4), refer to the description of step e3) in the third embodiment.

The glass phosphor powder sheet obtained by this embodiment include a reflective layer and light emitting layers, and can be used in reflective-type high power laser light sources. The released glass phosphor powder sheets that include the reflective layer are suitable for use with substrates that cannot resist high temperature, such as aluminum, copper, alloy and other metal substrates, or substrates that have good thermal conductivity but low reflectivity, such as metal, alloy, and ceramic substrates. The released glass phosphor powder sheets that includes the reflective layer can be affixed to a desired substrate using an adhesive, soldering, brazing, etc., and used in reflective-type high power laser light sources.

Fifth Embodiment a5) Obtaining a first optical functional material (high reflective particles), a second optical functional material (a phosphor powder), a glass powder and an organic carrier; mixing the glass powder and the organic carrier to form an adhesive slurry, mixing the high reflective particles, the glass powder and the organic carrier to form a first slurry, and mixing the phosphor powder, the glass powder and the organic carrier to form a second slurry.

Coating the adhesive slurry on the substrate, and drying the substrate at 50-200° C. for 5-60 minutes, to obtain the substrate coated with an adhesive coating.

b5) Coating the first slurry on the surface of the substrate that has been coated with the adhesive coating, and drying it at a first temperature (50-200° C.) for 5-60 minutes, to obtain a first functional layer (a reflective layer) that has a smooth surface and is free of cracks and where the particles on the surface of the layer will not fall off.

c5) Coating the second slurry on the surface of the reflective layer, to obtain a second functional layer (a light emitting layer).

d5) Placing the glass phosphor powder sheet, which includes the substrate coated with the adhesive layer, the reflective layer, and the light emitting layer, in an electric furnace, and sintering it under a 450-1500° C. temperature to obtain a finished product. The finished product of glass phosphor powder sheet can be used in reflective-type high power laser light sources.

In this embodiment, coating the substrate with an adhesive layer improves the adhesion of the glass phosphor powder sheet to the substrate, and prevents the glass phosphor powder sheet peeling off which could be a problem when the glass phosphor powder sheet directly contacts the substrate. Preferably, the softening point of the glass powder of the adhesive layer is hither than the softening point of the glass powder of the glass phosphor powder sheet, to ensure that the glass phosphor powder sheet is stable during high temperature sintering.

Another embodiment of the present invention provides a light emitting device, which includes the multi-layer glass phosphor powder sheet of any of the above embodiments, and further includes an excitation light source for generating an excitation light, where the multi-layer glass phosphor powder sheet receives the excitation light and emits a converted light.

It will be apparent to those skilled in the art that various modification and variations can be made in the fabrication methods for multi-layer glass phosphor powder sheet and related light emitting devices of the present invention without departing from the spirit or scope of the invention. Thus, it is intended that the present invention cover modifications and variations that come within the scope of the appended claims and their equivalents.

What is claimed is:

1. A method for fabricating a multi-layer glass phosphor powder sheet, comprising:
   a) mixing a first optical functional material, a glass powder and an organic carrier to form a first slurry, and mixing a second optical functional material, the glass powder and the organic carrier to form a second slurry; wherein at least one of the first optical functional material and the second optical functional material includes a phosphor powder;
   b) coating the first slurry on a first substrate, and drying the substrate at a first temperature to volatilize at least some of the organic carrier, to obtain a first functional layer, the first temperature being lower than a softening point of the glass powder, wherein the first substrate is a metal substrate including one or more of aluminum, copper, aluminum alloy, and iron alloy, or the first substrate is a ceramic substrate having a thermal expansion coefficient higher than thermal expansion coefficients of the phosphor powder and the glass powder;
   c) coating the second slurry on a surface of the first functional layer that has been dried but has not been sintered, to obtain a second functional layer;
   d) sintering the first substrate which is coated with the first and second functional layers at a second temperature, wherein the first and second functional layers coated on the substrate are in un-sintered states before the sintering, to obtain a multi-layer glass phosphor powder sheet; and
   e) releasing the multi-layer glass phosphor powder sheet from the first substrate, transferring the glass phosphor powder sheet to a second substrate, sintering the glass phosphor powder sheet and the second substrate at a fourth temperature, and releasing the glass phosphor powder sheet from the second substrate, to obtain a multi-layer glass phosphor powder sheet separate from the substrate, wherein the second substrate is a ceramic substrate, and wherein the fourth temperature is 500-1450° C.

2. The method of claim 1, wherein in step b), the first temperature is 50-200° C., and a drying time is 5-60 minutes.

3. The method of claim 1, wherein the first substrate is a ceramic substrate, which includes one or more of aluminum oxide, aluminum nitride, silicon carbide, silicon nitride, and zirconium oxide.

4. The method of claim 1, wherein the first substrate includes an adhesive coating, formed by:
coating an adhesive slurry, which is formed by mixing the glass powder and the organic carrier, on the first substrate, and drying the first substrate at 50-200° C. for 5-60 minutes, to obtain the first substrate coated with the adhesive coating.

5. The method of claim 1, wherein in step d), the second temperature is 450-1500° C.

6. The method of claim 1, wherein step d) further includes annealing the sintered first substrate at a third temperature, the third temperature being 300-800° C. and lower than the second temperature.

7. The method of claim 1, wherein in step d), the second temperature is 400-900° C.

8. The method of claim 7, wherein step d) further includes annealing the sintered first substrate at an annealing temperature lower than the second temperature, the annealing temperature being 200-800° C.

9. The method of claim 1, wherein the glass powder includes a mixture of one or more of silicate glass, lead borosilicate glass, aluminate glass, soda lime glass, and quartz glass, which have different softening points,
wherein a weight of the glass powder as a percentage of a total weight of the glass powder and the optical functional material is less than 60%, and
wherein the optical functional material is the first optical functional material or the second optical functional material.

10. The method of claim 1, wherein the organic carrier is a mixture of one or more of phenyl silicone oil, methyl silicone oil, ethanol, glycol, xylene, ethyl cellulose, terpineol, butyl carbitol, PVA (polyvinyl acetate), PVB (polyvinyl butyral), and PEG (polyethylene glycol).

11. The method of claim 1, wherein the phosphor powder is a mixture of one or more of a yellow phosphor powder, a red phosphor powder, a green phosphor powder, an orange phosphor powder, and a cyan phosphor powder.

12. The method of claim 1, wherein the first optical functional material or the second optical functional material includes reflective particles,
wherein the reflective particles include a mixture of one or more of powder particles of aluminum oxide, aluminum nitride, magnesium oxide, boron nitride, zinc oxide, zirconium oxide, and barium sulfate, the powder particles having particle sizes between 50 nm to 5 μm.

13. The method of claim 12, wherein the first optical functional material is reflective particles and the second optical functional material is a phosphor powder.

14. The method of claim 1, wherein each of the first optical functional material and the second optical functional material includes a phosphor powder.

15. The method of claim 1, further comprising, between step c) and step d):
   f) drying the second functional layer at a temperature below the softening point of the glass powder volatilize at least some of the organic carrier; and
   coating a third slurry formed by mixing a third optical functional material, the glass powder and the organic carrier over the second functional layer, to obtain a third functional layer.

* * * * *